United States Patent
Wortman et al.

(10) Patent No.: US 9,436,250 B1
(45) Date of Patent: *Sep. 6, 2016

(54) APPARATUS FOR IMPROVING POWER CONSUMPTION OF COMMUNICATION CIRCUITRY AND ASSOCIATED METHODS

(75) Inventors: Curt Wortman, Milpitas, CA (US); Keith Duwel, San Jose, CA (US); Michael Menghui Zheng, Fremont, CA (US)

(73) Assignee: Altera Corporation, San Jose, CA (US)

( * ) Notice: Subject to any disclaimer, the term of this patent is extended or adjusted under 35 U.S.C. 154(b) by 911 days.

This patent is subject to a terminal disclaimer.

(21) Appl. No.: 13/330,635

(22) Filed: Dec. 19, 2011

(51) Int. Cl.
*G06F 1/00* (2006.01)
*G06F 1/32* (2006.01)

(52) U.S. Cl.
CPC .................................. *G06F 1/32* (2013.01)

(58) Field of Classification Search
CPC ...................................................... G06F 1/32
USPC ......................................................... 713/300
See application file for complete search history.

(56) References Cited

U.S. PATENT DOCUMENTS

| | | | |
|---|---|---|---|
| 5,903,373 A * | 5/1999 | Welch | H04B 10/40 398/127 |
| 6,351,176 B1 | 2/2002 | Houston | |
| 6,621,325 B2 | 9/2003 | Gitlin et al. | |
| 7,120,804 B2 * | 10/2006 | Tschanz et al. | 713/300 |
| 7,129,745 B2 | 10/2006 | Lewis et al. | |
| 7,348,827 B2 | 3/2008 | Rahim et al. | |
| 2003/0063513 A1 | 4/2003 | Tsunoda et al. | |
| 2003/0102904 A1 | 6/2003 | Mizuno et al. | |
| 2004/0123170 A1 * | 6/2004 | Tschanz et al. | 713/320 |
| 2004/0239394 A1 | 12/2004 | Miyazaki et al. | |
| 2004/0251484 A1 | 12/2004 | Miyazaki et al. | |
| 2006/0202713 A1 * | 9/2006 | Shumarayev | G06F 17/5054 326/38 |
| 2007/0168685 A1 * | 7/2007 | Sasagawa | 713/323 |
| 2010/0250261 A1 * | 9/2010 | Laaksonen et al. | 704/500 |
| 2011/0300822 A1 * | 12/2011 | Catreux-Erceg | H04B 7/061 455/277.2 |
| 2011/0309447 A1 * | 12/2011 | Arghavani et al. | 257/368 |

FOREIGN PATENT DOCUMENTS

| | | |
|---|---|---|
| JP | 60-001071 | 1/1985 |
| JP | 03-035473 | 4/1991 |
| JP | 03-269248 | 10/1991 |

OTHER PUBLICATIONS

Tsugo Kobayashi et al., *Self-Adjusting Threshold Voltage Scheme (SATS) for Low-Voltage High-Speed Operation*, IEEE 1993 Custom Integrated Circuits Conference (1994), pp. 271-274.

Tadahiro Kuroda et al., *A 0.9V 150MHz 10mW 4mm² 2-D Discrete Cosine Transform Core Processor with Variable-Threshold-Voltage Scheme*, 1996 IEEE Int'l Solid-State Circuits Conf., 1996, 3 pp.

(Continued)

*Primary Examiner* — Mohammed Rehman

(57) ABSTRACT

An integrated circuit (IC) includes communication circuitry, a body bias generator, and a controller. The communication circuitry includes a physical medium attachment (PMA) and a physical coding sublayer (PCS). The body bias generator provides body bias signals to the PMA and PCS. The controller controls the body bias generator such that the body bias signals are controlled to improve a power consumption of the communication circuitry.

18 Claims, 8 Drawing Sheets

(56) References Cited

OTHER PUBLICATIONS

Masayuki Miyazaki et al., *A 1000-MIPS/W Microprocessor using Speed-Adaptive Threshold-Voltage CMOS with Forward Bias*, 2000 IEEE Int'l Solid-State Circuits Conf., 2000, 3 pp.

Masayuki Miyazaki et al., *A Delay Distribution Squeezing Scheme with Speed-Adaptive Threshold Voltage CMOS (SA-Vt CMOS) for Low Voltage LSIs*, ACM 1998, pp. 48-53.

*Altera Transceiver PHY IP Core User's Guide*, Altera Corporation, Nov. 2011, 210 pp.

\* cited by examiner

APPARATUS FOR IMPROVING POWER CONSUMPTION OF COMMUNICATION CIRCUITRY AND ASSOCIATED METHODS

TECHNICAL FIELD

The disclosed concepts relate generally to electronic circuitry and devices such as integrated circuits (ICs) and, more particularly, to apparatus for improving power consumption of communication circuitry in electronic devices, such as field-programmable logic devices (PLDs), and associated methods.

BACKGROUND

Advances in electronics has allowed increased level of integration. The technology for fabrication of ICs has contributed to those advances, and has provided a vehicle for integrating a relatively large number of circuits and functions into an IC. As a result, present-day ICs might contain hundreds of millions of transistors. The transistors implement the functionality of a relatively large number of blocks, such as logic circuits, memory, processors, and communication circuits. As a consequence of the rise in the number of transistors, the power consumption, power dissipation, die temperatures and, hence, power density (power dissipation in various circuits or blocks), of ICs has tended to increase.

SUMMARY

In one exemplary embodiment, an integrated circuit (IC) includes communication circuitry, a body bias generator, and a controller. The communication circuitry includes a physical medium attachment (PMA) and a physical coding sublayer (PCS). The body bias generator provides body bias signals to the PMA and PCS. The controller controls the body bias generator. The body bias signals are controlled to improve a power consumption of the communication circuitry.

In another exemplary embodiment, an integrated circuit (IC) includes communication circuitry, and a body bias generator. The communication circuitry includes a physical medium attachment (PMA) and a physical coding sublayer (PCS). The body bias generator provides body bias signals to the PMA and PCS. The body bias signals are dynamically reconfigured during operation of the IC to improve a power consumption of the communication circuitry.

In yet another exemplary embodiment, a method of operating an integrated circuit (IC) includes generating body bias signals by using a body bias generator, and providing the body bias signals to a physical medium attachment (PMA) and a physical coding sublayer (PCS) in communication circuitry of the IC. The method further includes controlling the body bias signals so as to improve a power consumption of the communication circuitry.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate to apparatus and methods for improving power consumption in electronic circuits and devices, such as ICs or PLDs. More specifically, the disclosure relates to apparatus and techniques for improving power consumption of communication circuitry in such circuits and devices. By controlling the body-bias values of one or more transistors, groups or blocks of transistors, or all transistors, in communication circuitry in ICs or electronic devices, the disclosed concepts provide apparatus and techniques for improving power consumption of the communication circuitry.

Figure 1:
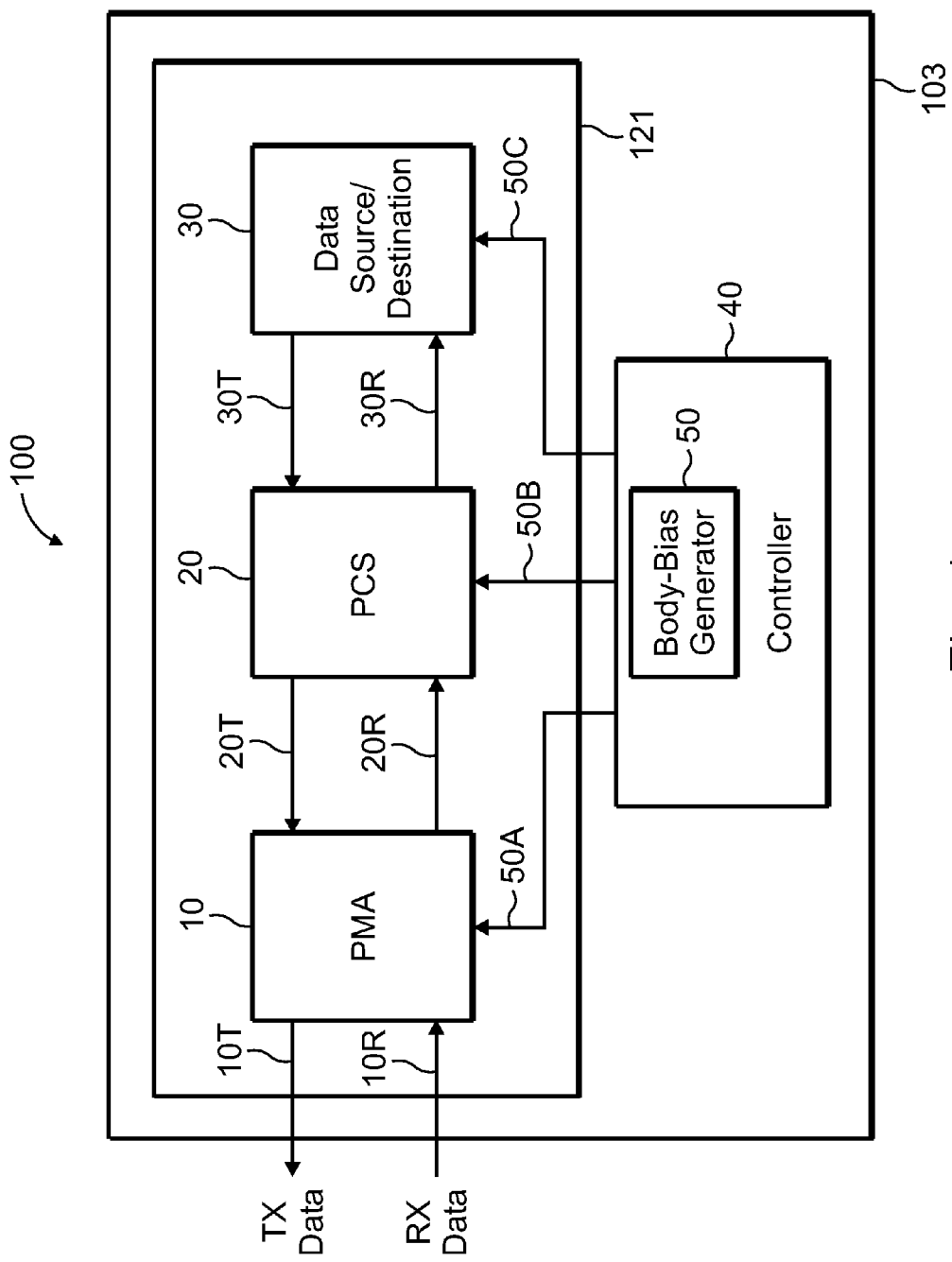
FIG. 1 illustrates a block diagram of an electronic device according to an exemplary embodiment.

FIG. 1 illustrates a block diagram of an electronic device or IC 103 according to an exemplary embodiment. Generally, device 103 may be integrated (e.g., an IC, PLD, application specific IC (ASIC), etc.), and/or it may include discrete circuitry, and/or a combination of discrete and integrated circuitry. Without loss of generality, the description below may refer to IC 103.

Referring to FIG. 1, IC 103 includes physical medium attachment (PMA) 10, physical coding sublayer (PCS) 20, data source/destination 30, and controller 40. In the embodiment shown, controller 40 includes body-bias generator 50 although, as persons of ordinary skill in the art understand, other embodiments may use other arrangements. For example, in some embodiments, body-bias generator may constitute a separate circuit or block of circuitry that couples to or communicates with controller 40.

PMA 10 and PCS 20 constitute a transceiver, which is typically part of the communication circuitry. More specifically, PMA 10 and PCS 20 provide a mechanism for IC 103 to communicate with (i.e., transmit information to and/or receive information from another circuit or device). In the embodiment shown in the figures, PMA 10 and PCS 20 provide support for duplex communication, i.e., they provide IC 103 with the capability to transit information to, and receive information from, another circuit or device. As persons of ordinary skill in the art understand, in other embodiments, either transmit or receive capability may be provided, as desired.

PMA 10 and PCS 20 implement at least in part the physical layer (PHY) of communication circuitry 121. PMA 10 includes circuitry for transmitting and receiving information via links 10T and 10R, respectively. Through links 10T and 10R, IC 103 may communicate with external circuitry (not shown). In some embodiments, PMA 10 and links 10T and 10R may support differential transmission of information, and differential reception of information, respectively.

Furthermore, in some embodiments, PMA 10 may support programmable pre-emphasis and programmable output differential voltage (VOD) in the transmit path circuitry or channel. Conversely, in some embodiments, PMA 10 may support programmable equalization in the receive path circuitry or channel. Regardless of the implementation chosen, one or more transistors in PMA 10 receive body-bias values or signals 50A from body-bias generator 50.

As noted above, PCS 20 implements part of the PHY layer of communication circuitry 121. Generally speaking, PCS 20 performing encoding, decoding, clock compensation, word alignment, error detection and monitoring, scrambling, descrambling, etc. The choice of the functions depends on the desired communication protocols, as persons of ordinary skill in the art understand. Example protocols include PCIe, Gigabit Ethernet, 10 Gigabit Ethernet, Fibre Channel, SerialLite II, and the like.

Regardless of the desired protocol, PCS 20 provides transmit data or information to PMA 10 via link 20T. Conversely, PCS 20 accepts data or information from PMA 10 via link 20R. Regardless of the implementation chosen, one or more transistors in PCS 20 receive body-bias values or signals 50B from body-bias generator 50.

As noted, IC 103 also includes an information or data source or destination 30. Data source/destination 30 provides transmit data to PCS 20 via link 30T. Conversely, data source/destination 30 accepts receive data from PCS 20 via link 30R. Data source/destination 30 may have a variety of implementations. For example, in some embodiments (e.g., using programmable resources within a PLD, described below), data source/destination 30 may be implemented using "soft" logic or circuitry (programmable circuitry). In some embodiments, data source/destination 30 may use "hard" or hardened logic or circuitry (integrated in IC 103). Regardless of the implementation chosen, one or more transistors in data source/destination 30 receive body-bias values or signals 50C from body-bias generator 50.

Controller 40 may provide various control or supervisory functions in IC 103 generally. In some embodiments, controller 40 may provide control and supervisory functions to body-bias generator 50. In some embodiments, in addition to controlling body-bias generator 50, controller 40 may provide other control or supervisory functions. For example, controller 40 may control the functionality of communication circuitry 121. As another example, controller 40 may control the functionality of one or more of PMA 10 and PCS 20.

Note that although the exemplary embodiment in FIG. 1 shows a single PMA 10, a single PCS 20, and a single data source/destination 30, other arrangements may be used. For example, in some embodiments, more than one PMA 10, more than one PCS 20, and more than one data source/destination 30 may be used. In such scenarios, body-bias generator 50 may provide one or more body-bias values to one or more transistors in PMAs 10, PCSs 20, and data source/destinations 30. For instance, in some embodiments, each of PMAs 10, PCSs 20, and data source/destinations 30 may receive individual body-bias values. As another example, some of PMAs 10, PCSs 20, and data source/destinations 30 may receive individual body-bias values, and some of PMAs 10, PCSs 20, and data source/destinations 30 may receive the same body-bias values. As yet another example, in some embodiments, all of PMAs 10, PCSs 20, and data source/destinations 30 may receive the same body-bias values.

The body-bias value(s) provided to the transistor(s) in communication circuitry 121 in IC 103 determine or influence the performance of communication circuitry 121. For example, the body-bias value(s) affect the speed of operation of the transistor(s), power dissipation of the circuit(s) in which the transistor(s) reside, etc. As noted, body-bias values for transistors affect their operating characteristics, such as power dissipation or consumption, and speed.

Typical communication circuits use metal oxide semiconductor (MOS) transistors. The drain current of the MOS transistor in the saturation region of operation depends on the threshold voltage and the gate-to-source voltage of the transistor:

$$i_D = K(v_{GS} - V_T)^2, \tag{1}$$

where $i_D$ is the total drain current (i.e., including AC and DC components), K represents a constant, $v_{GS}$ constitutes the total gate-to-source voltage (i.e., including AC and DC components), and $V_T$ denotes the threshold voltage.

The threshold voltage, $V_T$, depends on a number of factors, such as the voltage between the source and body regions of the transistor. The following equation provides the threshold voltage as a function of the body-to-source voltage:

$$V_T = V_{T(0)} + \gamma \{\sqrt{2\phi_F - v_{BS}} - \sqrt{2\phi_F}\}. \tag{2A}$$

Alternatively, one may write Equation 2A in terms of the source-to-body voltage:

$$V_T = V_{T(0)} + \gamma \{\sqrt{2\phi_F - v_{SB}} - \sqrt{2\phi_F}\}, \tag{2B}$$

where $V_{T(o)}$ constitutes the threshold voltage with the source-to-body voltage (or body-to-source voltage) set to zero, $\gamma$ is the body factor, a constant that depends on the doping levels of the body, $\phi_F$ denotes a constant, $v_{BS}$ is the total body-to-source voltage (i.e., including AC and DC components), and $V_{SB}$ represents the total source-to-body voltage (i.e., including AC and DC components). Note that when the body-to-source voltage, $V_{BS}$ (or source-to-body voltage, $v_{SB}$) equals zero, the threshold voltage, $V_T$, equals $V_{T(o)}$.

As Equation 2B shows, for a finite body factor, $\gamma$, the transistor's threshold voltage increases as the source-to-body voltage, $v_{SB}$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity $(v_{GS} - V_T)$ and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability (one measure of performance) of the transistor. The decreased current-drive capability of the transistor in turn leads to slower circuit operation and, ultimately, to slower operation of the PLD that includes the transistor.

The power dissipation of the transistor also varies according to changes in its threshold voltage. For example, the transistor leakage current varies as a function of the threshold voltage. More specifically, a smaller threshold voltage increases the OFF-state leakage current ($I_{off}$) of the transistor, and vice-versa. The $I_{off}$ of the transistor affects its static (non-switching) power dissipation. Thus, changing the threshold voltage by adjusting the body bias affects the power dissipation of the MOS transistor.

Note that the source-to-body voltage, $v_{SB}$, may be positive or negative. For an n-channel transistor, a positive source-to-body voltage, $v_{SB}$, provides forward body-bias and, conversely, a negative source-to-body voltage, $v_{SB}$, causes reverse body-bias of the transistor. For a p-channel transistor the reverse relationship applies. Part of the forward body-bias flows into the body or substrate. Nevertheless, forward body-bias can increase or improve operating speed of the transistor in the presence of relatively high leakage currents.

As the above description shows, one may affect the performance of the MOS transistor by adjusting its body bias and hence its source-to-body voltage (ultimately resulting in a change in its threshold voltage). Adjusting the body bias affects performance measures such as current-drive capability, speed of operation, power dissipation, etc. Hence, by adjusting the body-bias values of one or more transistors in communication circuitry 121 of IC 103, the power dissipation of the transistors may be controlled or changed.

By providing desired or appropriate body-bias values to the transistor(s), the power dissipation of communication circuitry 121 (PMA 10, PCS 20, and/or data source/destination 30) may be improved. For example, in some embodiments, body-bias values provided to communication circuitry 121 may cause less leakage in the transistors and, hence, less power dissipation. Depending on the desired protocol (e.g., desired data rate), the body-bias values may be adjusted to slow-down or speed-up the transistor(s).

Figure 2:
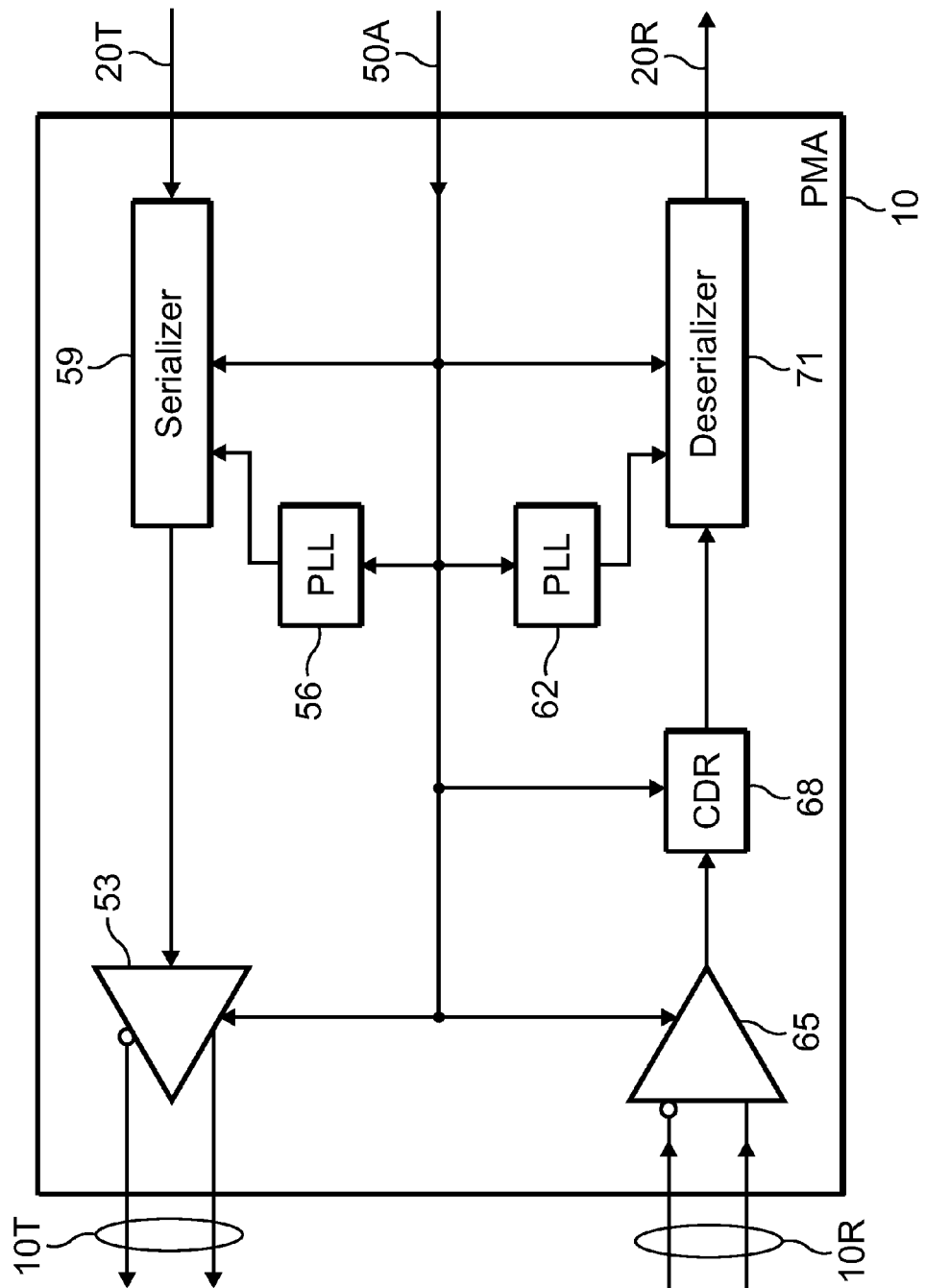
FIG. 2 shows a block diagram of a physical medium attachment (PMA) according to an exemplary embodiment.

FIG. 2 shows a block diagram of a PMA circuit 10 according to an exemplary embodiment. In the transmit path, PMA 10 includes serializer 59, phase locked loop (PLL) 56, and transmitter 53. Serializer 59 transforms information received via link 20T to a serial format, and provides the serialized information to transmitter 53. Transmitter 53 (typically a buffer) transmits the serialized information onto link 10T (differential in the embodiment shown). PLL 56 provides one or more signals, such as local oscillator signals or high- and low-speed clock signals, to serializer 59.

In the receive path, PMA 10 includes receiver 65, PLL 62, clock data recovery (CDR) circuit 68, and deserializer 71. Receiver 65 (typically a buffer) receives data or information via link 10R (differential in the embodiment shown). PLL 62 provides one or more signals, such as local oscillator signals or high- and low-speed clock signals, to deserializer 71. CDR circuit 68 recovers a clock signal from the received data. Deserializer 71 transforms the received data from a serial format into a desired format, e.g., a parallel format.

Note that FIG. 2 shows a general block diagram of PMA 10. As persons of ordinary skill in the art understand, many other implementations are possible, and fall within the scope of the disclosure. Regardless of the exact implementation used, one or more transistors in one or more blocks (e.g., serializer 59, PLL 56, and/or transmitter 53) receive body-bias signal 50A from body-bias generator 50 (not shown).

Figure 3:
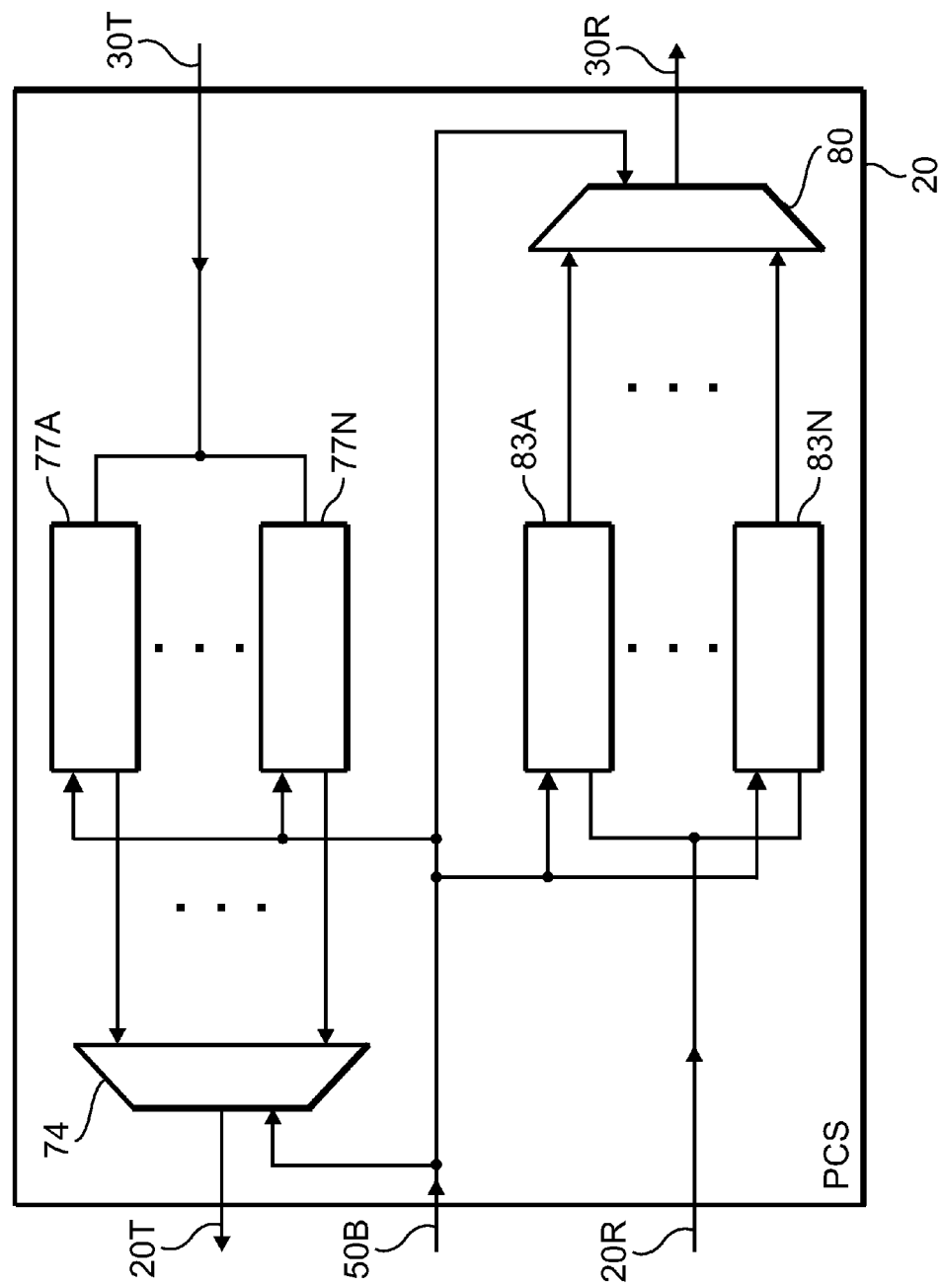
FIG. 3 depicts a block diagram of a physical coding sublayer (PCS) according to an exemplary embodiment.

FIG. 3 depicts a block diagram of a PCS circuit 20 according to an exemplary embodiment. In the transmit path, PCS 20 includes one or more (generally N) transmit signal processing circuits 77A-77N, and multiplexer (MUX) 74. Transmit signal processing circuits 77A-77N provide the desired functionality (as described above, for example) for the transmit path of PCS 20 by performing desired signal processing on data received via link 30T. MUX 74 receives the respective outputs of the one or more transmit signal processing circuits 77A-77N. In response to one or more select signals (not shown; from controller 40 in FIG. 1, for example), MUX 74 provides one of the respective outputs of the one or more transmit signal processing circuits 77A-77N as an output signal of PCS 20 via link 20T.

In the receive path, PCS 20 includes one or more (generally N) receive signal processing circuits 83A-83N and MUX 80. Receive signal processing circuits 83A-83N provide the desired functionality (as described above, for example) for the receive path of PCS 20 by performing desired signal processing on data received via link 20R. MUX 80 receives the respective outputs of the one or more receive signal processing circuits 83A-83N. In response to one or more select signals (not shown; from controller 40 in FIG. 1, for example), MUX 80 provides one of the respective outputs of the one or more receive signal processing circuits 83A-83N as an output signal of PCS 20 via link 30R.

As noted above, FIG. 3 shows a general block diagram of PCS 20. As persons of ordinary skill in the art understand, many other implementations are possible, and fall within the scope of the disclosure. Regardless of the exact implementation used, one or more transistors in one or more blocks (e.g., transmit signal processing circuits 77A-77N, MUX 74, receive signal processing circuits 83A-83N, and/or MUX 80) receive body-bias signal 50B from body-bias generator 50 (not shown).

Body-bias generator 50, in conjunction with other circuitry of controller 40 (see FIG. 1), allows for a variety of flexible arrangements for controlling the body bias levels of transistor(s) in communication circuitry 121 in IC 103. In some embodiments, the user of IC 103 may provide commands or instructions for setting the body bias levels. In some embodiments, the user may provide the body bias values directly. The foregoing embodiments may use a register to allow the user to exercise control over the body bias values provided to communication circuitry 121.

Figure 4:
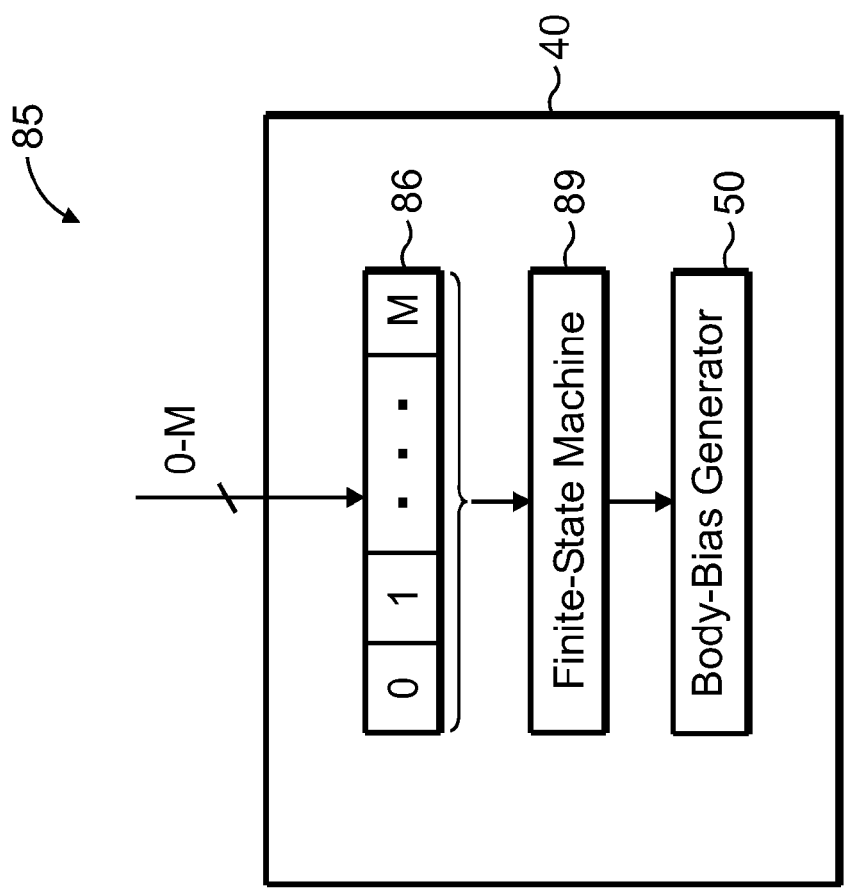
FIG. 4 illustrates a block diagram of a circuit arrangement for controlling body-bias values according to an exemplary embodiment.

FIG. 4 illustrates a block diagram of a circuit arrangement 85 for controlling body-bias values using a register 86. Generally speaking, register 86 may have a desired width, such as M bits in the embodiment shown. The user writes to register 86 to provide commands or instructions (e.g., when or how often to change body bias values; which transistors' body bias values to change, etc.), body bias values, or both. By setting or adjusting the body bias values, the user may achieve desired performance characteristics, a trade-off between performance and power consumption, etc.

In some embodiments, the user's input may provide specific body bias values depending on the type of communication desired, speed of communication desired, etc. In some embodiments, the user's input may be based on performance characteristics of part or all of communication circuitry 121. Thus, the user (or functionality the user implements in IC 103, for example, by using programmable resources, processors, etc.) may monitor some figure of merit for one or more communication channels, circuits, etc., and control one or more body bias values based on the result.

For example, the user (or circuitry internal or external to IC 103) may monitor a bit error rate (BER) of a communication channel in order to determine whether the respective part of communication circuitry 121 has appropriate body bias value(s) to support a desired BER. The user (or circuitry) may control (adjust, set, etc.) the body bias value(s) in order for the communication channel to meet the desired performance criterion/criteria. Thus, in this manner, communication circuitry 121 may be dynamically reconfigured or tuned, as desired.

Controller 40 includes some circuitry, for example, a finite-state machine (FSM) 89 in the particular embodiment in FIG. 4, to accept and process the information the user writes to register 86. Thus, where the information includes an instruction, FSM 89 may obtain and decode the instruction to ascertain how/when the user wants to adjust, set, or change body bias values, for which circuits/transistors (e.g., part of communication circuitry 121 (for example, PMA, PCS) or circuitry for one or more communication channels, etc.).

In some embodiments, the user's input may include a word of M bits that includes both the instruction and the body bias values. In other embodiments, the user's input may include one or more words that provide the instruction, followed by one or more words that provide body bias values. In yet other embodiments, the user's input may simply provide one or more body bias values, for example, body bias values that apply to a desired number of transistors in communication circuitry 121. In all cases, FSM 89 may obtain and process the user's input in order to set or adjust body bias values for one or more transistors in communication circuitry 121 of IC 103.

Figure 5:
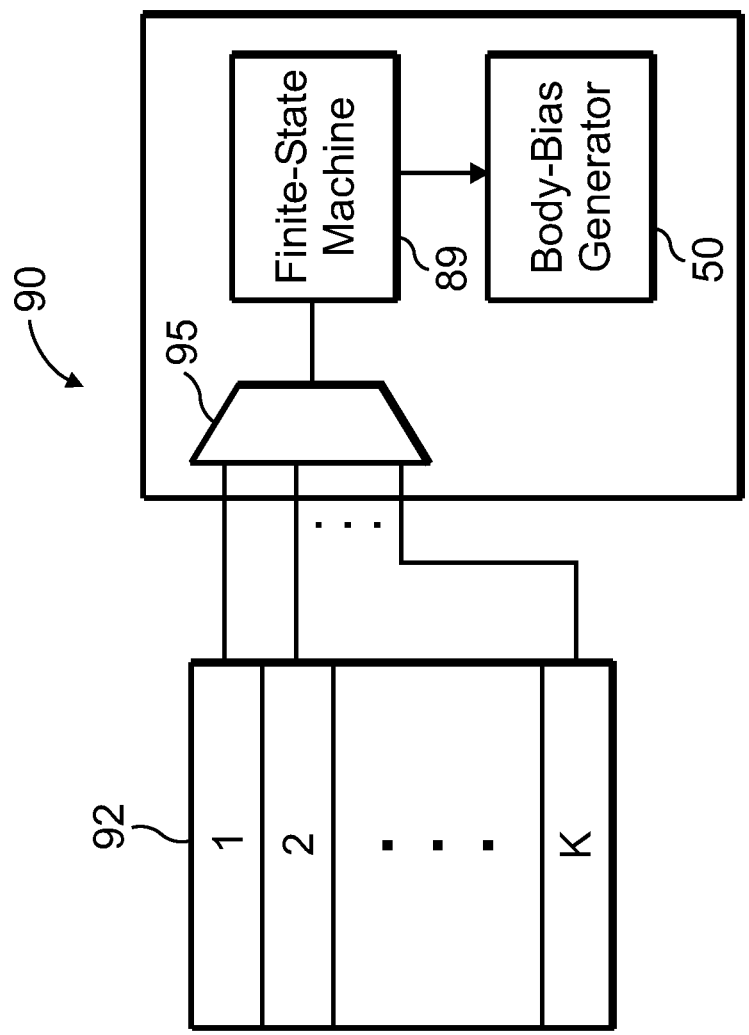
FIG. 5 shows a block diagram of a circuit arrangement for controlling body-bias values according to another exemplary embodiment.

Another technique for dynamic reconfiguration may use pre-determined (e.g., look-up tables) or calculated (e.g., as a function of one or more parameters or variables, such as speed, BER, etc.) body bias values for one or more transistors in communication circuitry 121. FIG. 5 shows a block diagram of a circuit arrangement 90 for dynamic reconfiguration of communication circuitry 121 by controlling (setting, adjusting, or both) body-bias values according to another exemplary embodiment.

The embodiment shown in FIG. 5 uses a storage circuit 92 to store pre-determined body bias values or parameters and/or variables for calculating body bias values. Storage circuit 92 may constitute circuitry internal or external to IC 103. Storage circuit 92 may use a wide variety of circuitry, such as read only memory, programmable memory (flash, PROM), etc. In some embodiments, storage circuit 92 stores body bias values (profiles) for one or more transistors or groups of transistors or blocks of circuitry in communication circuitry 121. In some embodiments, storage circuit 92 stores parameters or variables that might be used to calculate body bias values for one or more transistors or groups of transistors or blocks of circuitry in communication circuitry 121. The calculation of body bias values may use other variables, such as BER, power budget, etc.

Generally, storage circuit 92 may store K sets of body bias values, or K variables or parameters, or K words of data. MUX 95 (under the control of FSM 89 or other circuitry in controller 40) provides information from desired locations of storage circuit 92 to circuitry within FSM 89. FSM 89 determines the appropriate body bias values for the transistor(s), circuit(s), or block(s) in communication circuitry 121, and provides the body bias values to such transistor(s), circuit(s), or block(s). FSM 89 may change the body bias values (profiles) or re-calculate body bias values and, hence, dynamically reconfigure communication circuitry 121, as described above.

Figure 6:
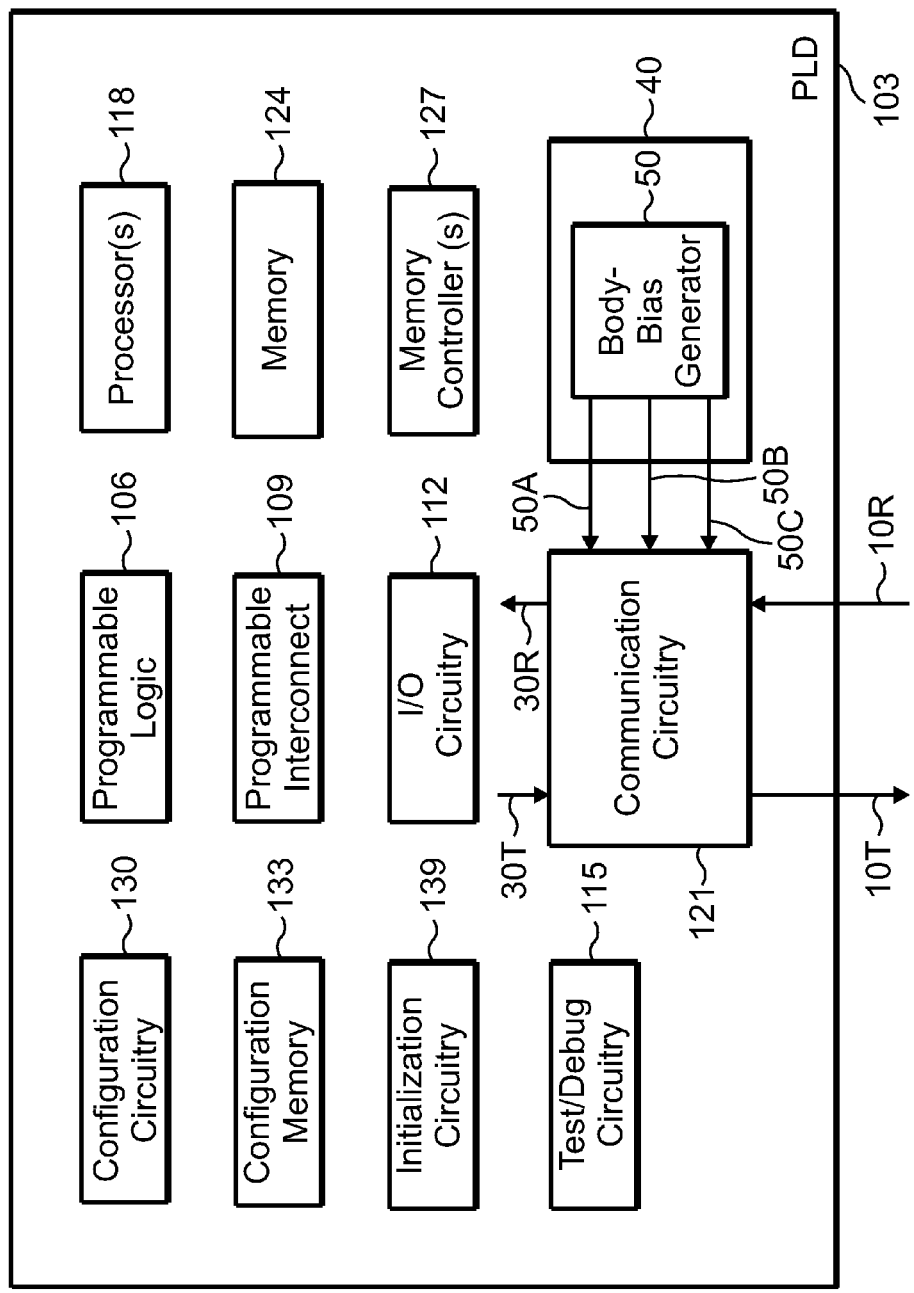
FIG. 6 depicts a block diagram of a PLD according to an exemplary embodiment.

As noted, the control of body bias values of communication circuitry 121 may be performed in a variety of electronic devices, for example, PLDs. FIG. 6 depicts a situation where IC 103 constitutes a PLD. In particular, FIG. 6 shows a block diagram of a PLD 103 that includes controller 40, body bias generator 50, and communication circuitry 121 (one or more transmitters/receivers/transceivers).

Referring to FIG. 6, PLD 103 includes configuration circuitry 130, configuration memory (CRAM) 133, programmable logic 106, programmable interconnect 109, and I/O circuitry 112. In addition, PLD 103 may include test/debug circuitry 115, one or more processors 118, one or more communication circuitry 121, one or more memories 124, one or more memory controllers 127, and initialization circuit 139, as desired.

Note that the figure shows a general block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-signal circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

In addition to providing control and supervisory functions with respect to the communication circuitry 121, in some embodiments controller 40 controls various operations within PLD 103. In such embodiments, under the supervision of controller 40, PLD configuration circuitry 130 uses configuration data (which it typically obtains from an external source, such as a storage device, a host, etc.) to program or configure the functionality of PLD 103.

In typical embodiments, CAD software (described below in detail) provides the capability to capture and implement a user's design (e.g., implement an electronic circuit or system with a desired set of specifications or functionality) using resources in PLD 103. This process results in configuration data that embody the specifications or functionality of the desired system or circuit. Configuration data are typically stored in CRAM 133. The contents of CRAM 133 determine the functionality of various blocks of PLD 103, such as programmable logic 106, programmable interconnect 109 and, in some embodiments, communication circuitry 121. Initialization circuit 139 may cause the performance of various functions at reset or power-up of PLD 103.

I/O circuitry 112 may constitute a wide variety of I/O devices or circuits, as persons of ordinary skill in the art understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the disclosure in this document appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may further include one or more memories 124 and one or more memory controller(s) 127. Memory 124 allows the storage of various data and information (such as user-data, intermediate results, calculation results, etc.) within PLD 103. Memory 124 may have a granular or block form, as desired. Memory controller 127 allows interfacing to, and controlling the operation and various functions of memory 124 and/or one or more memories external to PLD 103. For example, memory controller 127 may constitute a memory controller that interfaces to and controls an external synchronous dynamic random access memory (SDRAM), as desired.

Communication circuitry 121, controller 40, and body bias generator may provide the functionality described above. In some embodiments, the programmable resources of the PLD, such as programmable logic 106 and/or interconnect 109, may be used to implement desired parts of communication circuitry 121. In some embodiments, the programmable resources of the PLD, such as programmable logic 106 and/or interconnect 109, may be used to implement a source of data for communication circuitry 121, and/or a destination of data for communication circuitry 121 (e.g., similar to data source/destination circuit 30 in FIG. 1). In some embodiments, data source/destination 30 (not shown in FIG. 6) may be hardened (i.e., not use the programmable resources of PLD 103). In yet other embodiments, data source/destination 30 (not shown in FIG. 6) may use a combination of some hardened circuitry and some of the programmable resources of PLD 103, as desired.

Furthermore, PLD 103 may include circuitry for receiving data and/or instructions from the user to control the body bias of one or more transistors in communication circuitry 121. For example, PLD 103 may include one or more registers, as described above, for the purpose of controlling body bias values. As another example, PLD 103 may include circuitry for dynamic reconfiguration of communication circuitry 121, as described above.

One may obtain the user input (e.g., instructions and/or data for controlling body bias values) using a variety of techniques. In some embodiments, part of I/O circuitry 112 may be used to obtain the user's input from a source external to PLD 103. In some embodiments, programmable resources within PLD 103 may be used to implement a circuit that provides one or more user inputs to control body bias values. In yet other embodiments, hardened circuits in PLD 103 may be used to provide one or more user inputs to control body bias values.

Figure 7:
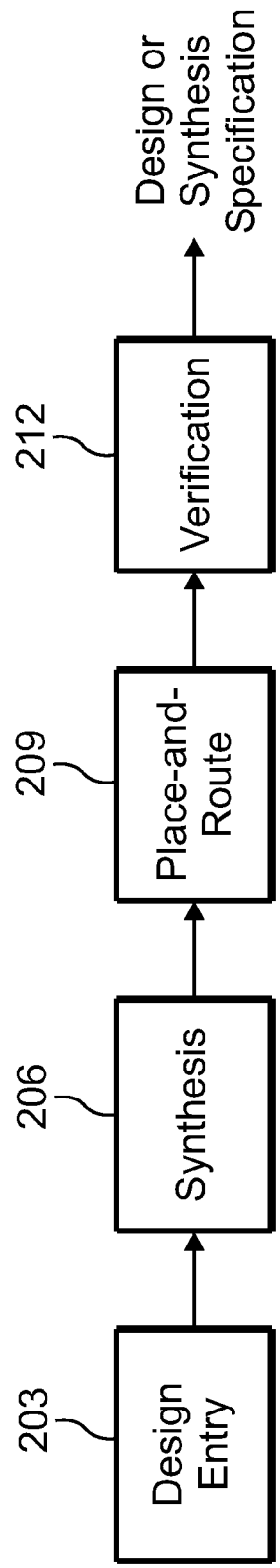
FIG. 7 illustrates a block diagram of various modules of a PLD computer-aided design (CAD) software according to an exemplary embodiment.

As noted above, CAD software (or a CAD flow) may be used to program various functions within a PLD, including control of body bias values (at least to the extent that programmable resources of the PLD are used to control body bias values, using, for example, the techniques described in this patent document). FIG. 7 illustrates a block diagram of various modules of a PLD computer-aided design (CAD) software according to an exemplary embodiment. The modules include design-entry module 203, synthesis module 206, place-and-route module 209, and verification module 212. The following description provides a simplified explanation of the operation of each module.

The CAD techniques may have a variety of applications, as persons of ordinary skill in the art understand. Examples include design area, timing performance, power requirements, and routability, as desired. Design-entry module 203 allows the editing of various design description files using graphical or textual descriptions of a circuit or its behavior, such as schematics, hardware description languages (HDL), or waveforms, as desired. The user may generate the design files by using design-entry module 203 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired. The user may include specifications or design for controlling body bias values, as desired.

Synthesis module 206 accepts the output of design-entry module 203. Based on the user-provided design, synthesis module 206 generates appropriate logic circuitry that realizes the user-provided design. One or more PLDs (not shown explicitly), such as PLD 103 described above, implement the synthesized overall design or system.

Synthesis module 206 may also generate any glue logic that allows integration and proper operation and interfacing of various modules in the user's designs. For example, synthesis module 206 provides appropriate hardware so that an output of one block properly interfaces with an input of another block. Synthesis module 206 may provide appropriate hardware so as to meet the specifications of each of the modules in the overall design or system.

Furthermore, synthesis module 206 may include algorithms and routines for optimizing the synthesized design. Through optimization, synthesis module 206 seeks to more efficiently use the resources of the one or more PLDs that implement the overall design or system. Synthesis module 206 provides its output to place-and-route module 209. Following synthesis, one may include a technology mapping module (not shown explicitly).

Place-and-route module 209 uses the designer's timing specifications to perform optimal logic mapping and placement. The logic mapping and placement determine the use of logic resources within the PLD(s). By the use of particular programmable interconnects with the PLD(s) for certain parts of the design (e.g., body bias control), place-and-route module 209 helps optimize the performance of the overall design or system. By the proper use of PLD routing resources, place-and-route module 209 helps to meet the critical timing paths of the overall design or system.

Place-and-route module 209 optimizes the critical timing paths to help provide timing closure faster in a manner known to persons of ordinary skill in the art understand. As a result, the overall design or system can achieve faster performance (i.e., operate at a higher clock rate or have higher throughput). Verification module 212 performs simulation and verification of the design. The simulation and verification seek in part to verify that the design complies with the user's prescribed specifications. The simulation and verification also aim at detecting and correcting any design problems before prototyping the design. Thus, verification module 212 helps the user to reduce the overall cost and time-to-market of the overall design or system.

Verification module 212 may support and perform a variety of verification and simulation options, as desired. The options may include functional verification, test-bench generation, static timing analysis, timing simulation, hardware/software simulation, in-system verification, board-level timing analysis, signal integrity analysis and electromagnetic compatibility (EMC), formal netlist verification, and the like, as persons of ordinary skill in the art understand. Note that one may perform other or additional verification techniques as desired and as persons of ordinary skill in the art understand. Verification of the design may also be performed at other phases in the flow, as appropriate, and as desired.

As noted above, although the above description concerns in parts the application of the disclosed concepts to PLDs, one may apply the disclosed concepts to a variety of other electronic circuits and devices, by making modifications that fall within the knowledge of persons of ordinary skill in the art. Some examples of such devices include custom, standard-cell, gate-array, field-programmable gate arrays (FPGAs), complex PLDs (CPLDs), and structured application specific integrated circuit (ASIC) implementations.

Figure 8:
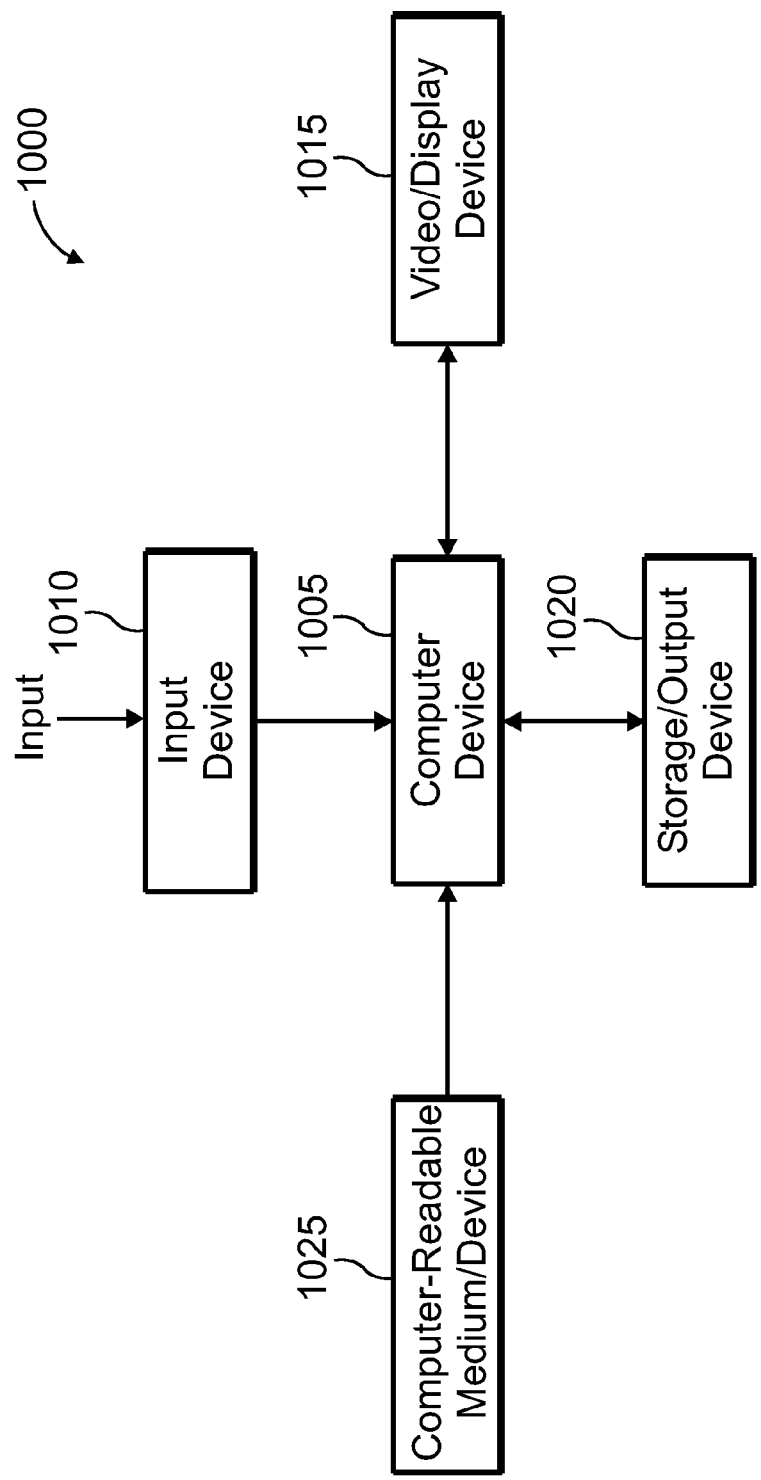
FIG. 8 shows a block diagram of an exemplary system for processing information according to the disclosed concepts.

FIG. 8 shows a block diagram of an exemplary system 1000 for processing information according to the disclosed concepts. One may run or execute the disclosed algorithms, methods, software (e.g., CAD software), or firmware (e.g., where part of the functionality of some circuitry, such as body bias control circuitry, is implemented using firmware) on computer systems or processors. Persons of ordinary skill in the art understand that one may use a wide variety of other information processing apparatus, computer systems, processors, microcomputers, workstations, and the like, as desired. Thus, FIG. 8 illustrates merely one example.

System 1000 includes a computer device 1005, an input device 1010, a video/display device 1015, and a storage/output device 1020, although one may include more than one of each of those devices, as desired. Computer device 1005 couples to input device 1010, video/display device 1015, and storage/output device 1020. System 1000 may include more that one computer device 1005, for example, a set of associated computer devices or systems, as desired, and as persons of ordinary skill in the art understand.

System 1000 operates in association with input from a user. The user input typically causes system 1000 to perform specific desired information-processing tasks, including circuit simulation. System 1000 in part uses computer device 1005 to perform those tasks. Computer device 1005 includes an information-processing circuitry, such as a central-processing unit (CPU), although one may use more than one CPU or information-processing circuitry, as persons skilled in the art would understand.

Input device 1010 receives input from the user and makes that input available to computer device 1005 for processing. The user input may include data, instructions, or both, as desired. Input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to computer device 1005. Similarly, the user operates the pointing device to provide cursor position or control information to computer device 1005.

Video/display device 1015 displays visual images or graphics to the user. The visual images may include information about the operation of computer device 1005, such as graphs, pictures, images, and text. The video/display device may constitute a computer monitor or display, a projection device, and the like, as persons of ordinary skill in the art would understand. If a system uses a touch-sensitive display or touchscreen, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may constitute a magnetic, optical, or magneto-optical drive capable of storing information on a desired medium and in a desired format. As another example, storage/output device 1020 may constitute a printer, plotter, or other output device to generate printed or plotted expressions of the information from the computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality. Moreover, within such functional descriptive material, computer programs define structural and functional interrelations between the computer programs and computer-readable medium 1025 and other aspects of system 1000. These interrelations permit the realization of the computer programs' functionality.

By way of illustration, computer device 1005 reads, accesses, or copies functional descriptive material into a computer memory (not shown explicitly in the figure) of computer device 1005. Computer device 1005 performs operations in response to the material present in the computer memory. Computer device 1005 may perform the operations of processing a computer application that causes computer device 1005 to perform additional operations. Accordingly, the functional descriptive material exhibits a functional interrelation with the way computer device 1005 executes processes and performs operations.

Furthermore, computer-readable medium 1025 constitutes an apparatus from which computer device 1005 may access computer information, programs, code, and/or applications. Computer device 1005 may process the information, programs, code, and/or applications that cause computer device 1005 to perform additional operations.

Note that one may implement computer-readable medium 1025 in a variety of ways, as persons of ordinary skill in the art would understand. For example, memory within computer device 1005 may constitute a computer-readable medium 1025, as desired. Alternatively, computer-readable medium 1025 may include a set of associated, interrelated, coupled (e.g., through conductors, fibers, etc.), or networked computer-readable media, for example, when computer device 1005 receives the functional descriptive material from a network of computer devices or information-processing systems. Note that computer device 1005 may receive the functional descriptive material from computer-readable medium 1025, the network, or both, as desired.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art understand. Other modifications and alternative embodiments of the disclosed concepts in addition to those described here will be apparent to persons of ordinary skill in the art. Accordingly, this description teaches those skilled in the art the manner of carrying out the disclosed concepts and are to be construed as illustrative only.

The forms of the disclosed concepts and embodiments shown and described should be taken as the presently preferred or illustrative embodiments. Persons skilled in the art may make various changes in the shape, size and arrangement of parts without departing from the scope of the disclosure in this document. For example, persons skilled in the art may substitute equivalent elements for the elements illustrated and described here. Moreover, persons skilled in the art may use certain features of the disclosed concepts independently of the use of other features, without departing from the scope of the disclosure.

The invention claimed is:

1. An integrated circuit (IC), comprising:
communication circuitry, comprising a physical medium attachment (PMA) and a physical coding sublayer (PCS), to communicate with a communication channel;
a body bias generator to provide body bias signals to the PMA and PCS; and
a controller to control the body bias generator,
wherein the body bias signals are controlled to improve a power consumption of the communication circuitry, and wherein the body bias signals are controlled by monitoring a bit error rate (BER) of the communication channel and controlling the body bias signals based on the monitored bit error rate.

2. The integrated circuit (IC) according to claim 1, wherein the communication circuitry further comprises data source/destination circuitry.

3. The integrated circuit (IC) according to claim 2, wherein the body bias generator provides a body bias signal to the data source/destination circuitry.

4. The integrated circuit (IC) according to claim 3, wherein the body bias signal provided to data source/destination circuitry to improve a power consumption of the communication circuitry.

5. The integrated circuit (IC) according to claim 4, wherein the body bias provided to the data source/destination circuitry is applied to one or more transistors in the data source/destination circuitry.

6. The integrated circuit (IC) according to claim 1, wherein the body bias signals provided to the PMA and PCS are applied to one or more transistors in the PMA and PCS.

7. The integrated circuit (IC) according to claim 1, wherein the body bias signals are dynamically reconfigured.

8. The integrated circuit (IC) according to claim 7, wherein the IC comprises programmable logic and programmable interconnect coupled to the communication circuitry.

9. The integrated circuit (IC) according to claim 1, wherein the body bias signals are controlled in response to input provided by a user of the IC.

10. The integrated circuit (IC) according to claim 9, wherein the IC comprises programmable logic and programmable interconnect coupled to the communication circuitry.

11. An integrated circuit (IC), comprising:
communication circuitry, comprising a physical medium attachment (PMA) and a physical coding sublayer (PCS), to communicate with a communication channel;
a body bias generator to provide body bias signals to the PMA and PCS; and
wherein the body bias signals are dynamically reconfigured during operation of the IC to improve a power consumption of the communication circuitry, and wherein the body bias signals are controlled by monitoring a bit error rate of the communication channel and controlling the body bias signals based on the bit error rate.

12. The integrated circuit (IC) according to claim 11, wherein the body bias signals are dynamically reconfigured by using input provided by a user of the IC.

13. The integrated circuit (IC) according to claim 11, wherein the body bias signals are dynamically reconfigured by using predetermined body bias values.

14. The integrated circuit (IC) according to claim 11, wherein the body bias signals are dynamically reconfigured by calculating body bias values.

15. The integrated circuit (IC) according to claim 11, wherein the IC comprises programmable logic and programmable interconnect coupled to the communication circuitry.

16. A method of operating an integrated circuit (IC), the method comprising:
generating body bias signals by using a body bias generator;
providing the body bias signals to a physical medium attachment (PMA) and a physical coding sublayer (PCS) in communication circuitry of the IC to communicate with a communication channel; and
controlling the body bias signals so as to improve a power consumption of the communication circuitry, wherein controlling the body bias signals further comprises monitoring a bit error rate of the communication channel and controlling the body bias signals based on the monitored bit error rate.

17. The method according to claim 16, wherein controlling the body bias signals further comprises using input from a user of the IC to control the body bias values.

18. The method according to claim 16, wherein controlling the body bias signals further comprises dynamically reconfiguring the body bias signals.

* * * * *